United States Patent [19]
Thomas

[11] Patent Number: 5,130,579
[45] Date of Patent: Jul. 14, 1992

[54] ACTIVE LOWPASS RIPPLE FILTER

[75] Inventor: Gary D. Thomas, Lynchburg, Va.

[73] Assignee: Ericsson GE Mobile Communications Inc., Lynchburg, Va.

[21] Appl. No.: 615,057

[22] Filed: Nov. 19, 1990

[51] Int. Cl.$^5$ ............................ H03B 1/04; G06G 7/10
[52] U.S. Cl. .................................. 307/520; 307/543; 307/556; 307/491; 307/559; 328/167
[58] Field of Search ............... 307/510, 520, 521, 543, 307/556, 491, 246, 559, 317.1; 328/167

[56] References Cited

U.S. PATENT DOCUMENTS 3,207,915  9/1965  Brunschweiger ............... 307/510
4,401,898  8/1983  Sommerer ...................... 307/491

OTHER PUBLICATIONS

"Two Active Low-Pass Instrumentation Filters" Simpson, *Instruments and Control Systems*, vol. 44, No. 8, p. 45 Aug. 1971.

*Primary Examiner*—Stanley D. Miller
*Assistant Examiner*—Margaret Rose Wambach
*Attorney, Agent, or Firm*—Nixon & Vanderhye

[57] ABSTRACT

A lowpass ripple filter with an emitter follower active stage intermediate two filter stages for providing ripple sensitive circuit components with a regulated reference voltage of an acceptable operating value that is also substantially free of low frequency ripple.

9 Claims, 1 Drawing Sheet ns. Such supply voltages often include low frequency ripple. Additionally, such circuit boards often include components that are highly sensitive to any AC ripple in the supply voltage.

ACTIVE LOWPASS RIPPLE FILTER

FIELD OF THE INVENTION

The invention relates generally to lowpass ripple filters. More specifically, the invention disclosed relates to filters including an active stage for eliminating low frequency ripple from supply voltages for ripple intolerant devices such as phase lock loop circuit modules without suffering unacceptable loading and voltage losses.

BACKGROUND AND SUMMARY OF THE INVENTION

It is conventional in circuit design to supply circuit board components with relatively low DC voltages from regulated power supplies having low output impedances. Such supply voltages often include low frequency ripple. Additionally, such circuit boards often include components that are highly sensitive to any AC ripple in the supply voltage.

More specifically, exemplary circuit board components, such as phase lock loop circuit modules, although tolerant to a range of constant voltages are intolerant or very sensitive to low frequency ripple included in such constant voltages. Furthermore, attempts to supply such reference voltages that are essentially ripple free through the use of simple RC filters fail to solve the problem since selection of component values are subject to size constraints, and when selected to be sufficiently large as to be within acceptable size limits, either result in an insufficient amount of filtering or cause the input voltage to drop below minimum acceptable values for correct operation of the circuit components being supplied with the reference voltage.

I have discovered a manner of increasing ripple rejection without sustaining unacceptable voltage loss due to loading and thus insure proper operation of ripple sensitive circuits such as phase lock loop circuit modules. Essentially, such beneficial results are obtained by first filtering the reference voltage through the use of a simple RC filter wherein the filter components are selected so as to obtain good ripple rejection. Coupled to this first filter section is a DC coupled emitter follower amplifier stage which due to its characteristic high input impedance does not load down the reference voltage produced by the first section of the filter. Moreover, this active second filter section reproduces at its output a waveform that includes the reduction in ripple obtained by the first filter section. The reduced ripple preserved by the active second stage, however, is produced at a voltage that is increased by the voltage drop normally obtained by way of a forward biased emitter-base junction.

Thus, the output produced at the second stage of the active filter is at a level above the minimum acceptable input reference voltage and is also sufficiently high to allow a second stage of ripple rejection filtering to be included so long as the component values are selected to maintain at least the minimum acceptable reference voltage required by the circuit components being supplied.

The exemplary embodiment of the disclosed invention additionally includes a circuit diode for allowing fast charge of the filter components when the device is first turned on. Such inclusion permits downstream components to be completely operative with little or no time loss or delay.

Although the active lowpass ripple filter disclosed herein was conceived as a solution to a particular problem, namely, that of supplying a ripple free voltage to a phase lock loop circuit module on the transmit-receive circuit board of a portable radio, it is believed that those skilled in the art will recognize that my solution is applicable to a general class of problems involving the supply of ripple free reference voltages. Moreover, the objects and advantages of my invention will be more completely understood and appreciated by the artisan carefully studying the following description of the presently preferred exemplary embodiment taken in conjunction with the accompanying drawings of which:

DETAILED DESCRIPTION OF THE DRAWINGS

Many circuit board components require the application of DC reference potentials that are not only within a certain range of acceptable levels but are also substantially ripple free. For example, in the development of an 800 MHz portable radio having a transmit/receive circuit board including a phase lock loop module, a regulated 5.4 volt reference voltage was supplied to the board from an external source. The external source had a low output impedance which is typical of such voltage regulator circuits.

The phase lock loop module of the radio requires an input voltage which is normally 5.4 volts DC. The module, however, is tolerant of any constant voltage within a particular range, such as 5.1 to 5.7 v.d.c. Such modules, however, are extremely sensitive to any AC ripple on the reference voltage supply line. In the specific environment noted above, for example, it was found that the phase lock loop module was particularly sensitive to a ripple frequency of about 10 Hz.

Figure 1:
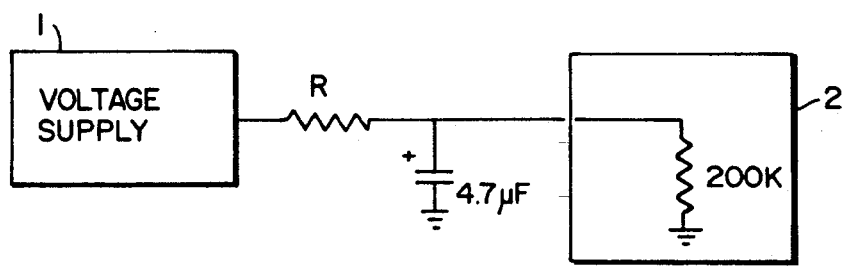
FIG. 1 illustrates a potential solution to the problem of eliminating ripple but one which produces unacceptable results.

To insure that the ripple sensitive module is supplied with a reference voltage that is essentially ripple free requires the addition of a lowpass filter between the external supply and the module. One such attempted solution to the problem is illustrated in FIG. 1 where element 2 is representative of an exemplary phase lock loop module which, for example, has a typical input impedance on the order of about 200K ohms. Such a module typically can accept any constant voltage within a particular range such as 5.1 to 5.7 volts DC which would be furnished by a conventional regulated voltage source illustrated at 1. The RC filter capacitor illustrated was limited to a 4.7 μF by size constraints in the particular application exhibiting the problem to be solved.

In order to provide a maximum amount of filtering, the resistor value must be relatively large. However, the resistor value cannot be so large as to reduce the 5.4 reference voltage supplied by source 1 below the minimum acceptable value for correct operation of the exemplary phase lock loop module (5.1 volts in the exemplary embodiment). Under such conditions the resistance value is determined as follows:

$$\left(\frac{200K}{200K + R}\right)5.4 \text{ vdc} = 5.1 \text{ vdc}$$
$$R = 11.76 \text{ k}\Omega$$

The ripple rejection in this exemplary embodiment, however, was insufficient to insure proper operation of the module. Moreover, a further increase in the size of the filter resistor would cause a reduction in the supplied reference voltage below the minimum value required for correct module operation.

Figure 2:
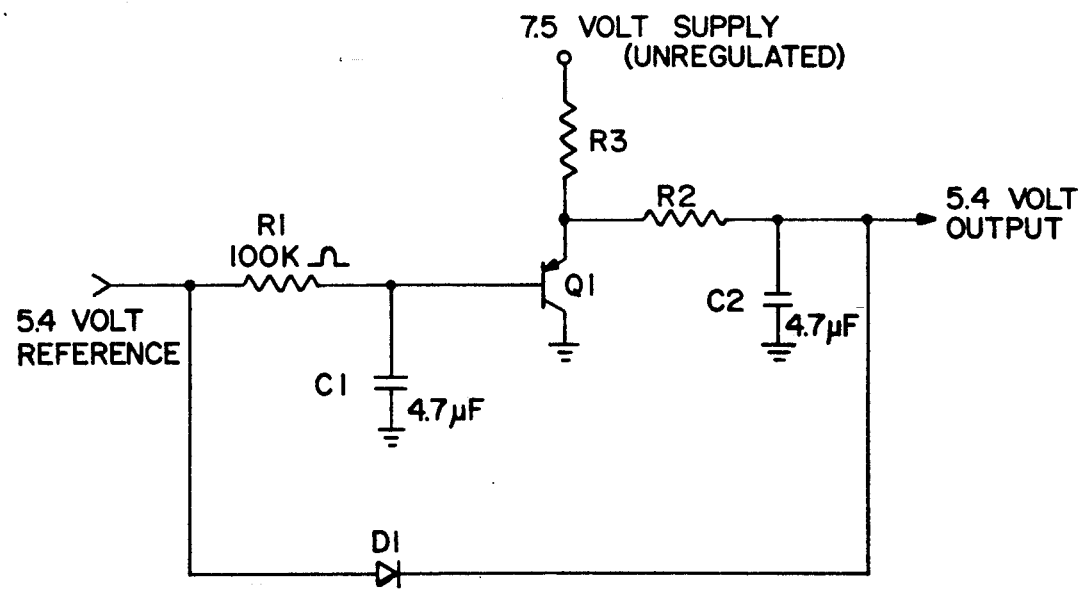
FIG. 2 illustrates the presently preferred embodiment of an active lowpass filter for reducing ripple but without producing an unacceptable voltage loss.

The circuit illustrated in FIG. 2, however, was found to not only increase the ripple rejection to acceptable levels but was also found to preserve the reference voltage at a steady state well within the operable range of reference voltages required by the phase lock loop module of the illustrative embodiment.

In the exemplary embodiment of FIG. 2, a 5.4 reference voltage is supplied to a first filter stage wherein although capacitor $C_1$ is of the same value as shown in FIG. 1, the resistance value of $R_1$ is substantially greater than the resistor of the filter illustrated in FIG. 1. As will be appreciated by those skilled in the art, this filter section if loaded directly by the typical input impedance of the phase lock loop module of FIG. 1 would produce a steady state voltage which is far too low for proper operation of the module, notwithstanding its obvious enhanced ripple rejection over the simple filter discussed with regard to FIG. 1.

The first stage filter of FIG. 2, however, is followed by a DC coupled emitter follower amplifier stage. Such amplifiers typically have high input impedance and, accordingly, in the exemplary embodiment of FIG. 2 would not load down the reference voltage at the output of the $R_1C_1$ first filter stage. Moreover, since the output in such amplifiers follows that of the input, the ripple rejection obtained in the first filtering stage would be maintained. Additionally, since as illustrated, the output voltage would be increased by an amount equal to the voltage drop present in the forward biased base-emitter junction. The emitter follower stage output would reproduce the waveform of the input but at a higher steady state voltage.

Thus, for example, in the embodiment illustrated in FIG. 2, although the ripple reduction obtained from the first stage filter is preserved at the emitter of $Q_1$, the steady state voltage would be higher than the reference voltage by, for example, the standard voltage drop of a forward biased emitter-base junction such as 0.7 volts. Accordingly, instead of the output being below the minimum acceptable lower limit of 5.1 volts, the supply at the emitter of Q1 would be higher than the nominal 5.4 volts and would produce a DC level of 6.1 volts.

This supply is used to drive a device such as the previously referenced phase lock loop module by way of a second stage of filtering comprising the $R_2C_2$ combination illustrated in FIG. 2. Such components further improve the ripple rejection, as well as reducing the available 6.1 volts down to the preferred exemplary value of 5.4 volts which is well within the acceptable operating range of the module. Under such conditions, the value of $R_2$ is determined as follows:

$$\left(\frac{200K}{200K + R_2}\right)6.1 \text{ vdc} = 5.4 \text{ vdc}$$
$$R2 = 25.9 \text{ k}\Omega$$

Thus, it may be seen that with circuitry constructed in the manner illustrated in FIG. 2, reference voltages may be obtained with an appropriate amount of ripple rejection added but without reducing the reference voltage to an inoperable level. As an additional feature, it will be noted that diode D1 is included in the circuit in such a manner that capacitor $C_2$ is charged directly from the 5.4 volt reference supply when the portable radio equipment for which the disclosed circuit is designed is first turned on. In the absence of such charging for the capacitor, the phase lock loop module would be inoperable for the period of time required to charge the filter stage capacitors. In light of the above it will be noted that the disclosed circuit was conceived as a solution to a specific problem encountered in producing an 800 MHz portable radio. In this regard, however, the artisan will recognize that the proposed solution is applicable to a general class of problems, although explained with reference to a specific problem.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A lowpass ripple filter comprising:
   an input voltage source means;
   a first stage means responsive to said input voltage source means for producing an output voltage having a waveform with reduced low frequency ripple;
   a second stage means responsive to said first stage means for reproducing the voltage waveform of said first stage means output voltage at a higher steady state amplitude;
   third stage means responsive to said higher steady state amplitude reproduced voltage for producing a voltage that is substantially free of low frequency ripple,
   wherein said second stage means is an emitter follower circuit and said first stage means is a RD filter circuit having a junction connected directly to a base of said emitter follower circuit and diode means connected to said first stage means for connecting said input voltage source to an output of said third stage means.

2. A lowpass ripple filter as in claim 1 wherein both said first and third stage means comprise RC filter stages.

3. A lowpass ripple filter as in claim 2 wherein said diode means charges a capacitor of said third stage means.

4. A lowpass ripple filter as in claim 1 wherein said second stage higher amplitude voltage is higher than said first stage output voltage by an amount substantially equal to the voltage drop present in the forward biased base-emitter junction of said emitter follower circuit.

5. A lowpass ripple filter for use with reference voltage sources for ripple voltage sensitive electrical devices operable at voltages within a predetermined range of reference voltages comprising:
   first and second filter stages respectively responsive to first and second input voltages for substantially reducing the low frequency ripple included in said input voltages and for respectively producing first and second output voltages having waveforms;
   a third active stage responsive to said first output signal for producing an amplified signal which is otherwise of substantially the same waveform as said first output signal;
   said second filter stage being responsive to said third active stage for providing said electrical devices with a reference voltage within said predetermined range that is substantially free of low frequency ripple, and
   diode means connected to said first filter stage for connecting said first input voltage to said second filter stage.

6. A lowpass ripple filter as in claim 5 wherein said first and second stage means are resistor-capacitor filter stages.

7. A lowpass ripple filter as in claim 5 wherein said third stage means comprises an emitter-follower amplifier circuit.

8. A lowpass ripple filter as in claim 9 wherein said third stage means amplifies said first output signal by an amount substantially equal to the voltage drop present in the forward biased base-emitter junction of said emitter follower circuit.

9. A lowpass ripple filter as in claim 6 further including means connected to said first filter stage for connecting said first input voltage to said second stage resistor-capacitor filter.

* * * * *